United States Patent [19]

Twiss

[11] 3,878,535

[45] Apr. 15, 1975

[54] PHASE LOCKED LOOP METHOD OF SYNCHRO-TO-DIGITAL CONVERSION

[75] Inventor: Frank Twiss, Issaquah, Wash.

[73] Assignee: Sundstrand Data Control, Inc., Redmond, Wash.

[22] Filed: June 8, 1972

[21] Appl. No.: 261,021

[52] U.S. Cl. .......... 340/347 SY

[51] Int. Cl. .......... H03k 13/02

[58] Field of Search .......... 340/347 SY, 347 AD; 235/194

[56] References Cited

UNITED STATES PATENTS

| | | | |
|---|---|---|---|
| 2,991,462 | 7/1961 | Hose | 340/347 SY |
| 3,284,795 | 11/1966 | Fertig et al. | 340/347 SY |
| 3,358,280 | 12/1967 | Dougherty | 340/347 SY |
| 3,438,026 | 4/1969 | Prill et al. | 340/347 SY |
| 3,508,252 | 4/1970 | Blarcom | 340/347 SY |
| 3,564,536 | 2/1971 | Hyatt | 340/347 SY |
| 3,573,794 | 4/1971 | Widenor | 340/347 SY |
| 3,651,514 | 3/1972 | Klatt | 340/347 SY |
| 3,668,693 | 6/1972 | Eaton | 340/347 SY |

*Primary Examiner*—Charles D. Miller
*Attorney, Agent, or Firm*—Wegner, Stellman, McCord, Wiles & Wood

[57] ABSTRACT

A circuit for converting analog signals angularly related to the position of a rotor of a synchro or resolver or the like into digital signals representing the rotor position utilizes a phase locked loop circuit with a voltage controlled oscillator from which is derived a phase signal shifted in phase with respect to the excitation signal in direct proportion to rotor position. A phase measuring circuit determines the number of cycles of the clock signal occurring during the time period corresponding to the phase difference between the phase signal and the excitation signal to produce a digital signal representative of the rotor position. The voltage controlled oscillator has a frequency which is variable in direct proportion with the frequency of the excitation signal to eliminate error in the phase measuring circuit due to frequency changes in the excitation signal.

7 Claims, 8 Drawing Figures

PATENTED APR 15 1975 3,878,535

SHEET 2 OF 5

PATENTED APR 15 1975

3,878,535

SHEET 4 OF 5

PHASE LOCKED LOOP METHOD OF SYNCHRO-TO-DIGITAL CONVERSION

BACKGROUND OF THE INVENTION

This invention relates to a demodulator for angularly related signals, and more particularly to a demodulator for converting the angle information carried by said signals into a digital form.

With the advent of digital computer technology, an increasing number of systems have evolved for converting the angular information carried by the amplitude characteristics of signals taken from synchros, resolvers, or the like into digital form. A synchro or resolver basically comprises a rotatable primary winding magnetically coupled with a plurality of secondary windings. The primary winding is rotatable with respect to the secondary windings, and the amplitude of the signals induced in the secondary windings is determined by the angular position of the primary winding with respect to the secondary windings. Specifically, the peak amplitude of the signal induced in the secondary windings is proportional to $\sin(\theta+\alpha)$ where $\alpha$ is the fixed angular position of the secondary winding under consideration relative to a fixed zero degree reference angle and $\theta$ is the angular position of the primary winding relative to the secondary winding. In a synchro where there are three secondary windings equally spaced around the primary winding, $\alpha$ equals 0°, 120° and 240°, respectively. In a basic resolver, where there are two secondary windings in spaced quadrature, $\alpha$ equals 0° and 90°, respectively.

Known methods of synchro to digital conversion perform several intermediate conversions before the ultimate digital signal is derived. First, if dealing with a synchro, the three signals are converted to two signals by means of a Scott-T transformer or the like and phase shifted relative to one another to put them into phase quadrature. This, of course, simulates the two output signals from a resolver. These two signals are added, the sum being a constant peak amplitude sinusoidal signal with a phase relative to the excitation signal representing the relative angular position of the primary winding. The relative phase of this signal is then placed into the time domain by developing a time signal corresponding to the relative phase between this phase signal and the excitation signal and converting this time signal into digital form by digitally counting the number of cycles of a fixed frequency clock signal during this time period.

The principal problem with this approach is that variations in the frequency of the excitation signal will cause variations in the time domain signal. The time period corresponding to a selected phase difference will be greater for a lower frequency than for a higher frequency. A number of approaches have been attempted to eliminate this frequency modulation problem. One approach has been to develop a rectangular wave signal having a duty cycle proportional to the phase difference between the phase and energization signals and converting the rectangular wave signal to a DC signal and finally converting the DC signal into digital form. Another approach has been to store the peak amplitudes of the synchro signals and to subsequently sum the stored signals in synchronism with the clock frequency.

SUMMARY OF THE INVENTION

While the above approaches do eliminate the frequency modulation problem to a greater or lesser extent, they encompass a great number of intermediate signal conversions which inherently add to possible error, and their complexity results in a cost which is prohibitive in many applications. In accordance with the present invention, a demodulator is disclosed which eliminates error due to variation in excitation signal frequency by causing the clock frequency to vary proportionally with the excitation frequency. A phase locked loop circuit is used for this purpose. The phase locked loop includes a voltage controlled oscillator having a frequency variable in direct proportion with an error signal applied to its input which, in turn, is proportional to the difference between the actual relative angular position of the primary winding and the relative phase angle between the excitation signal and the output of a frequency divider which produces a signal oscillating at a fixed fraction of the frequency of the voltage controlled oscillator. The frequency of the voltage controlled oscillator varies to minimize the error signal to zero thereby developing an output signal having a relative phase with respect to the energization signal which is proportional to the relative angular position of the rotor or primary winding.

A phase detector which produces the error signal includes in one embodiment analog gates for gating through preselected 180° portions of the synchro signals to a summing point where they are combined and passed through a filter to remove the excitation signal frequency component of the combined signal to produce the error signal. In another embodiment, phase detection occurs after summation of the synchro signals. Phase shifting circuits are provided between the analog gates and the voltage controlled oscillator output so that the proper 180° portions of the synchro signals are conducted through the analog gates to produce the desired error signal. Although the phase shifting circuits may comprise conventional RC circuits or operational amplifiers, in a preferred embodiment the phase shifting is achieved by selecting 180° pulses from the divider circuit to control the analog gates.

Any shift in the frequency of the synchronous signal appears as an apparent phase shift which is reflected in the error signal, so that the frequency of the voltage controlled oscillator varies in direct proportion with the frequency of the excitation signal. The voltage controlled oscillator is operated at a frequency much greater than that of the excitation signal and is used as the clock frequency. Since the frequency of the voltage controlled oscillator output varies in direct proportion with the frequency of the excitation signal the frequency modulation problems discussed above are eliminated. A divider circuit operating off of the voltage controlled oscillator reduces the frequency down to that of the excitation signal and provides the phase signal bearing the relative angular position information and providing the controls for the analog gate circuits.

Thus, an important feature of applicant's invention is the provision of a demodulator circuit in which error introduced by variations in excitation signal frequency is eliminated by utilization of a clock signal which varies in direct proportion with the excitation signal frequency.

Another feature of applicant's invention is the provision of a demodulator circuit in which a phase locked loop circuit having a voltage controlled oscillator to generate a clock signal which varies in direct proportion with the excitation signal frequency and which has a phase relative to that of the excitation signal directly proportional to the relative angular position of the primary winding is provided.

A further feature of applicant's invention is that the customary transformer for converting the three signals from a synchro into two signals may be eliminated.

Yet another feature of applicant's invention is the provision of a demodulator circuit in which phase shifting of various signals is performed by digital rather than analog circuits.

BRIEF DESCRIPTION OF THE DRAWINGS

Further features and advantages of the invention will be apparent from the following description taken in conjunction with the following drawings, in which.

DESCRIPTION OF THE PREFERRED EMBODIMENTS

Figure 1:
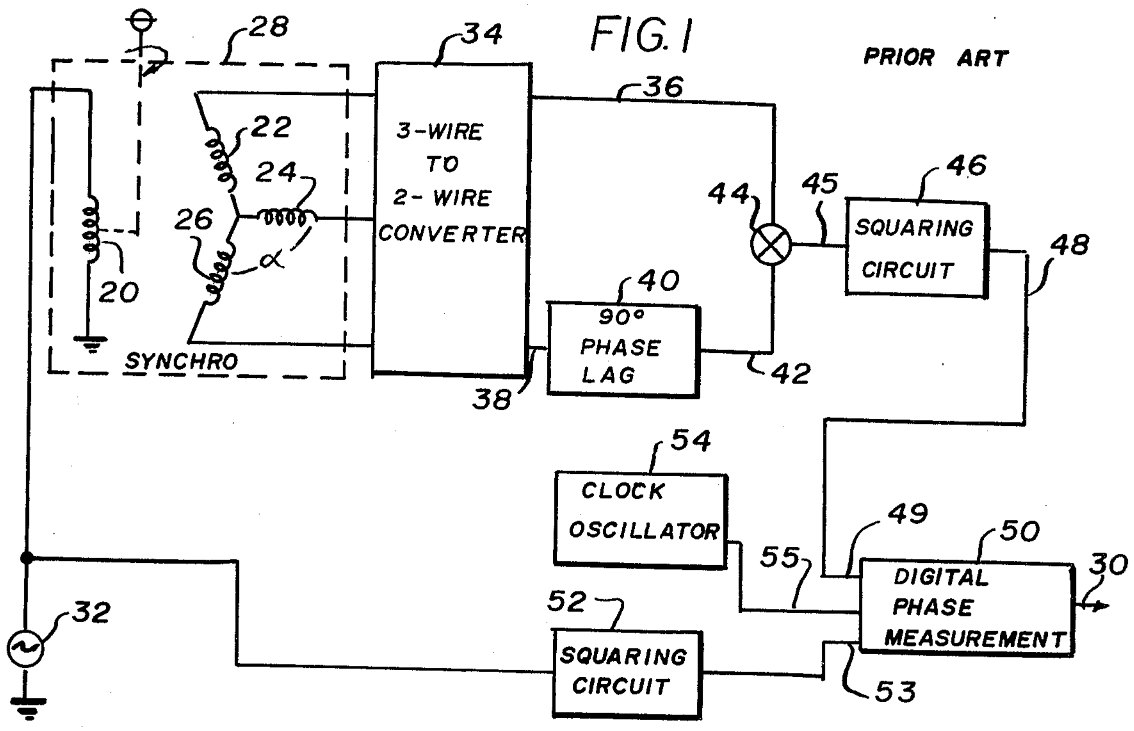
FIG. 1 is a schematic block diagram of a synchroto-digital converter of the prior art.

Turning now to FIG. 1, a block diagram of a synchro-to-digital converter circuit of the prior art is illustrated in which the angle $\theta$ of a rotor or primary winding 20 relative to stator or secondary windings 22, 24 and 26 of a synchro 28 is indicated in a digital manner on output 30. A source of excitation signal 32 is coupled to one side of primary winding 20, the other side of which is connected to ground reference potential. The excitation signal is in the form $E\sin\omega t$ where $\omega$ equals $2\pi$ times the frequency, which in most applications is 60 Hertz or 400 Hertz. The secondary windings 22, 24 and 26 are magnetically coupled with the primary winding and signals are induced therein of the form $E\sin(\theta+\alpha)\sin\omega t$, where $\alpha$ equals the angular position of the secondary winding under consideration with respect to a zero angle reference position which may, for purposes of discussion here, be considered to be the angular position of secondary winding 24. Typically, these signals are introduced to a 3-wire to 2-wire converter circuit 34 which may be a Scott-T transformer or any other suitable circuit which will convert the signals into a form represented by $E\sin\theta\sin\omega t$ on output 36 and $E\cos\theta\sin\omega t$ on output 38. This, of course, is the identical form of the outputs from the secondary windings of a resolver, and thus if the angular position in a resolver was being determined converter circuit 34 could be eliminated. The synchro signal on output 38 is coupled to a 90° phase lag circuit 40 which introduces a 90° phase lag into the signal on output 38. This phase delayed signal is produced on output 42 of phase lag circuit 40 in the form $E\cos\theta\cos\omega t$.

The two signals on outputs 36 and 42 are added together by summing circuit 44 to produce a phase signal of the form $E\sin\omega t+\theta$ on output 45. This result is apparent from the trigonometric identity, $\sin(x+y)=\sin x\cos y+\cos x\sin y$. This phase signal is coupled to a squaring circuit 46 which produces a square wave in phase with the phase signal on its output 48. Squaring circuit 46 may comprise a symmetrical Schmitt trigger circuit switching at zero cross-over points or any other suitable circuit for producing a square wave in phase with the phase signal applied thereto.

The squared phase signal on output 48 is coupled to an input 49 of a digital phase measuring circuit 50 which compares the phase of the squared phase signal at input 49 with the phase of the excitation signal at input 53 after it has been put into square wave form by a squaring circuit 52 similar in operation to squaring circuit 46. A clock oscillator 54 operating at a much greater frequency than that of the excitation signal, such as 60 KHz or 400 KHz, is provided to give a square wave time reference signal at input 55 of the digital phase measurement circuit 50.

Figure 2A:
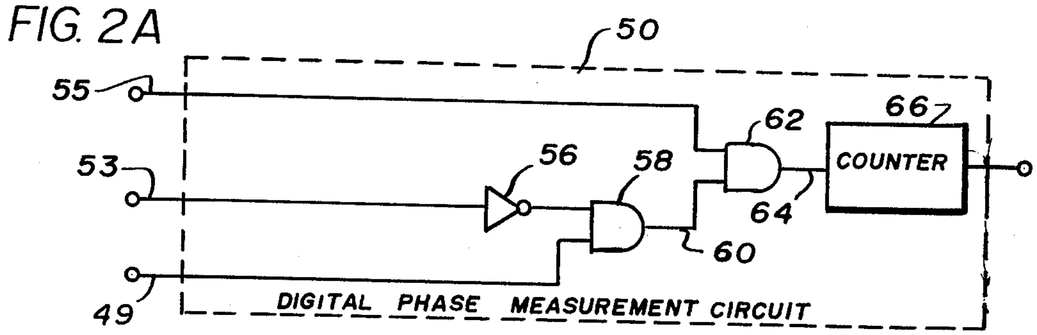
FIG. 2A is a block diagram suitable for use as the digital phase measurement circuit block shown in FIGS. 1, 3 and 5–8.
Figure 2B:
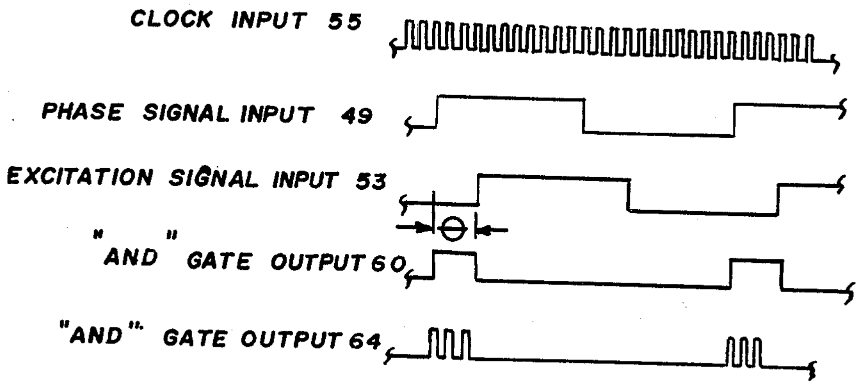
FIG. 2B is a comparative waveform for the various inputs and the output of the digital phase measurement circuit of FIG. 2A.

The operation of the phase measurement circuit is best illustrated by reference to FIG. 2A which is a schematic logic diagram of the phase measurement circuit block 50. Basically, the digital phase measurement circuit 50 develops an intermediate digital signal having a pulse width corresponding to the phase difference between the squared phase signal at input 49 and the squared excitation signal at input 53 during which time the clock signal may be digitally counted to provide an indication of the relative angular position of the primary winding. The squared excitation signal at input 53 is coupled through an inverter 56 to one input of a logic AND gate 58 and the squared phase signal at input 49 is coupled directly to another input of AND gate 58 which, as indicated in FIG. 2B, produces a high voltage, one-state pulse on its output 60 whenever squared phase signal input 49 is in a high voltage one-state and squared excitation signal input 53 is in a low voltage, one-state. As illustrated in FIG. 2B, this pulse width corresponds to relative angular position $\theta$ for any given frequency. Output 60 is coupled to an input of a second logic AND gate 62 which has its other input coupled to clock oscillator input 55. The signal on clock oscillator input 55 is reproduced on output 64 of AND gate 62 only during the period that output 60 of AND gate 58 is in the high voltage, one-state, and thus, the number of pulses produced on output 64 during this period is representative of the relative angular position $\theta$ of the primary winding. This signal may be coupled to a binary counter or register circuit 66 to provide a binary indication of the count which may then be decoded to give a direct indication of $\theta$.

The problem presented by frequency modulation which is solved by applicant's invention is simply as follows. The relative angular position $\theta$ represented by the one-state pulse width on AND gate output 60 is inversely proportional to the frequency of the excitation signal, but the frequency of the clock oscillator which provides the time reference for the digital phase measurement circuit is independent of excitation signal frequency. For any given relative phase angle, the digital phase measurement circuit will provide an indication of $\theta$ greater than the actual value for excitation signal frequencies less than the nominal frequency and an indication less than the actual value of $\theta$ for frequencies greater than the nominal excitation signal frequency. Applicant's invention overcomes this problem by varying the time reference or clock frequency in direct proportion with the excitation signal frequency so that regardless of the pulse width of AND gate output 60 for a given $\theta$, the number of clock oscillator cycles occurring during that period will remain constant.

Figure 3:
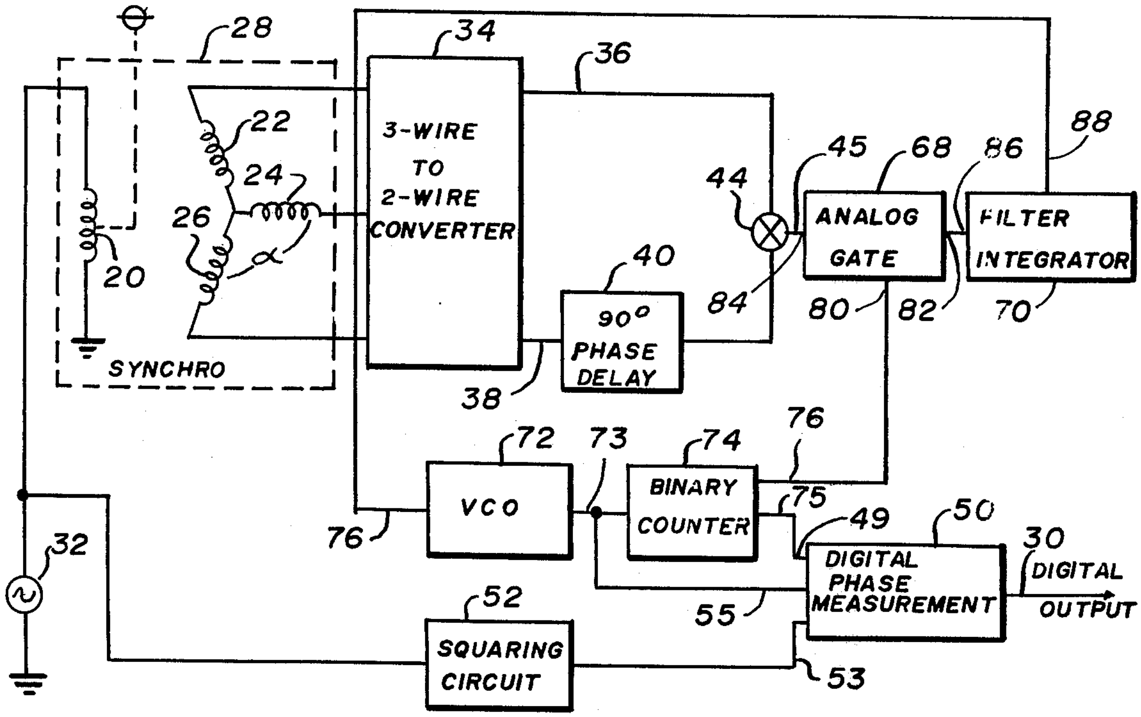
FIG. 3 is a block diagram of one embodiment of applicant's invention in which a three-wire to two-wire converter is utilized.

The manner in which the time reference for the digital phase measurement circuit 50 is varied in proportion with the excitation signal frequency is first illustrated in FIG. 3. Circuit and block diagram elements in FIG. 3 and subsequent figures of the drawings which have the same or similar function as corresponding elements in FIG. 1 will be given the same reference numeral. Further, for purposes of simplicity, rather than reproducing the logic diagram for the digital phase measurement circuit shown in FIG. 2A, the reference numerals for the three inputs to the digital phase measurement circuit block 50 shown in FIG. 2A will be maintained throughout the remaining drawings and circuit 50 will only be shown in block form.

As can be seen by comparison of FIGS. 3 and 1, the circuit of FIG. 3 is identical with that of FIG. 1 up to output 45 of summation circuit 44 on which a signal is produced of the form $E\sin(\omega t+\theta)$. Rather than introducing this signal to the digital phase measurement circuit clock 50, however, it is coupled to an analog gate 68 of what may be called a phase locked loop circuit comprising analog gate 68, filter integrater circuit block 70, voltage controlled oscillator or VCO circuit block 72 and binary counter circuit block 74 which produces on its output 75 the squared phase signal which is applied to input 49 of digital phase measurement circuit 50. The voltage controlled oscillator 72 is an oscillator which produces a square wave signal on its output 73 at a frequency within a preselected frequency range which is directly proportional to the magnitude of a signal applied to its control input 76. The VCO signal on output 73 comprises the time reference or clock signal which is applied to input 55 of the digital phase measurement circuit 50.

For accurate measurement of the one-state pulse width of AND gate output 60 of the digital phase measurement circuit 50 the clock signal should have a nominal frequency range much greater than the excitation signal frequency. As will be apparent from further discussion, the frequency at which the voltage controlled oscillator operates is determined in part by the extent of division by binary counter 74. Binary counter 74 divides the VCO signal on output 73 by 1,000, and the frequency of the voltage controlled oscillator is equal to 1,000 times the excitation frequency. It should be noted that although a thousand times the excitation frequency has been found suitable for most applications a greater, or lesser multiple of the excitation frequency could be used depending on whether greater accuracy in time measurement is desired or lesser accuracy is acceptable.

Binary counter 74 divides the frequency of the signal on output 73 of the VCO by 1,000 and produces a square wave gate signal on its output 76 at the excitation frequency and phase shifted with respect to the excitation signal by $90°+\phi$ where $\phi$ equals the relative phase of the signal on output 75 of binary counter 74 relative to the squared excitation signal. As stated, the signal on output 76 is a square wave, and thus the pulse duration corresponds to 180° of the excitation signal.

The gate signal on output 76 is applied to input 80 of analog gate circuit 68 which produces on its output 82 the 180° portion the of phase signal at its input 84 occurring during the one-state pulse of the wave signal at input 80. This 180° portion of the phase signal from $90°+\phi$ to $270°+\phi$ is applied to input 86 of filter circuit 70 which removes the excitation frequency component and the higher harmonics thereof from the signal and performs such other filtering as is needed for loop stability. In effect, the filter integrater circuit $E\sin(\omega$ in conjunction with the analog gate 68 controlled by the signal on output 76 of binary counter 74 integrates with respect to $\omega t$ the phase signal $E\sin\ t+\theta)$ from $90°+\phi$ to $270°+\phi$. The result of this integration is a signal produced on output 88 of filter integrator 70 of the form $E(\theta-\phi)$. For small errors, i.e., when $\theta-\phi$ is less than 5°, this is approximately equal to $E(\theta-\phi)$ where $\theta$ and $\phi$ are expressed in radians.

This error signal is applied to control input 76 of VCO 72. If $\phi$ is less than $\theta$, the frequency of the VCO increases to minimize the error, and if $\phi$ is greater than $\theta$, the frequency of the VCO decreases to minimize the error. When the loop is in a stable condition $\phi$ equals $\theta$ and the output of binary counter 78 produces a square wave signal in phase with $E\sin(\omega t+\theta)$ which is compared with the phase of the excitation signal $E\sin\omega t$ to produce the digital output signal representative of the relative angular position of the primary winding.

Of course, when the signal on output 75 of the binary counter is locked in phase with the phase signal appearing at output 45 of summation circuit 44 the frequency of the two signals must be identical. Any change in the excitation frequency is reflected in a change in the error signal and a corresponding change occurs in the frequency of the VCO clock frequency produced on output 73 and applied to clock input 55 of digital phase measurement circuit 50 thereby eliminating any error in phase measurement due to changes in the excitation signal frequency.

Figure 4:
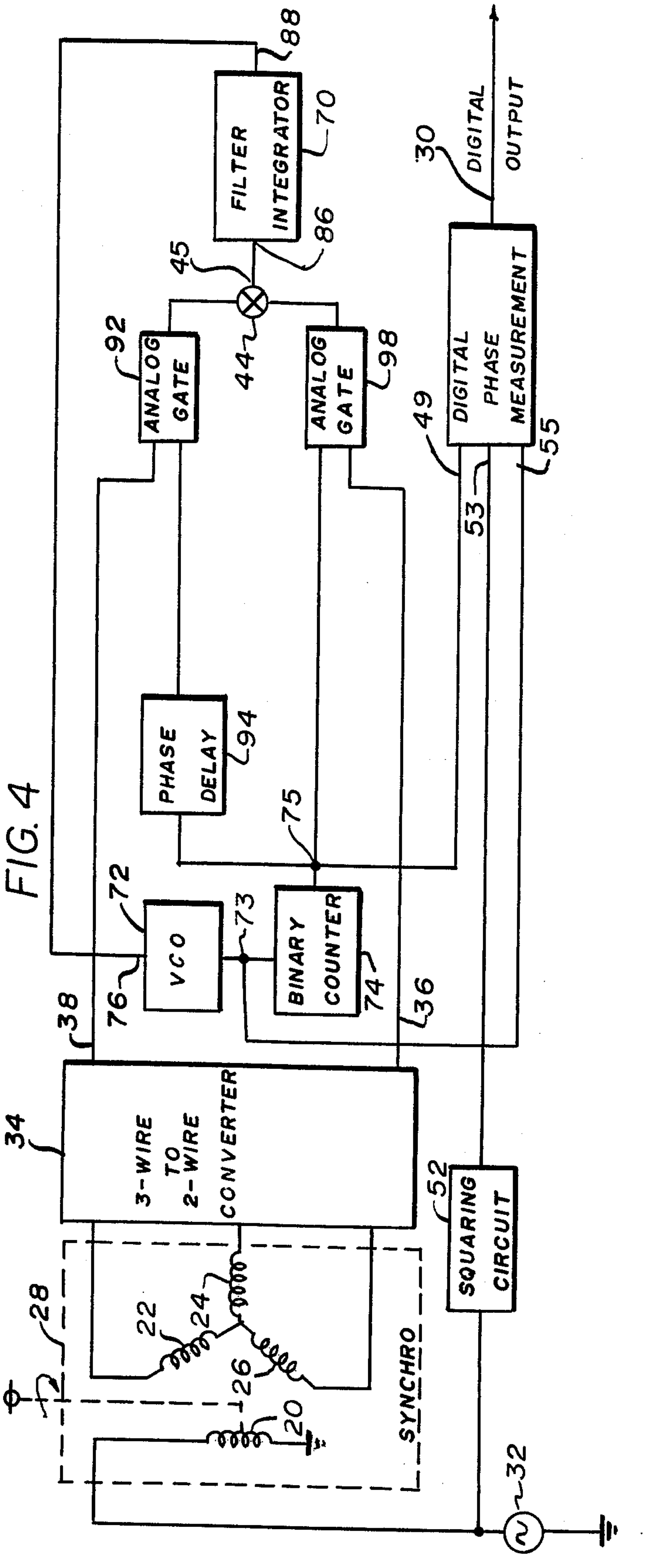
FIG. 4 is a block diagram of another embodiment of applicant's invention in which a three-wire to two-wire converter is utilized and phase shifting is performed in the analog realm.

Turning now to FIG. 4, a block diagram of another embodiment of applicant's demodulator or synchro-to-digital converter is shown in which phase detection is performed on the two outputs of 3-wire to 2-wire converter 34 prior to summing. Briefly, the synchro signal $E\cos\omega\sin\omega t$ on output 38 is coupled to an input of an analog gate 92 which is controlled by the signal on output 75 of binary counter 74, after it has been delayed in phase by 90° by phase delay circuit 94, to pass to summing circuit 44 a 180° portion of the synchro signal on output 38 from $90°+\phi$ to $270°+\phi$. Similarly, the signal $E\sin\theta\sin\omega t$ on synchro output 36 is coupled to an analog gate 98 which is controlled directly by the signal on output 75 of binary counter 74 to conduct to the summing circuit 44 a 180° portion of the synchro signal from $\phi$ to 180°+$\phi$. The summation of the respective 180° portions of the two synchro signals is produced on output 45 of summing circuit 44 and applied to input 86 of filter integrater circuit 70 which produces the error signal on its output 88 to control VCO 72. The error voltage may be mathematically represented as follows:

$$V_E = \int_{\phi}^{180°+\phi} E\sin\theta\sin(\omega t)\,d(\omega t) + \int_{90°+\phi}^{270°+\phi} E\sin(\theta+90°)\sin(\omega t)\,d(\omega t)$$

This integral is evaluated as $V_E = 2E\sin(\theta-\phi)$. As previously discussed, for small error signals this may be approximated by $V_E = 2E(\theta-\phi)$.

Figure 5:
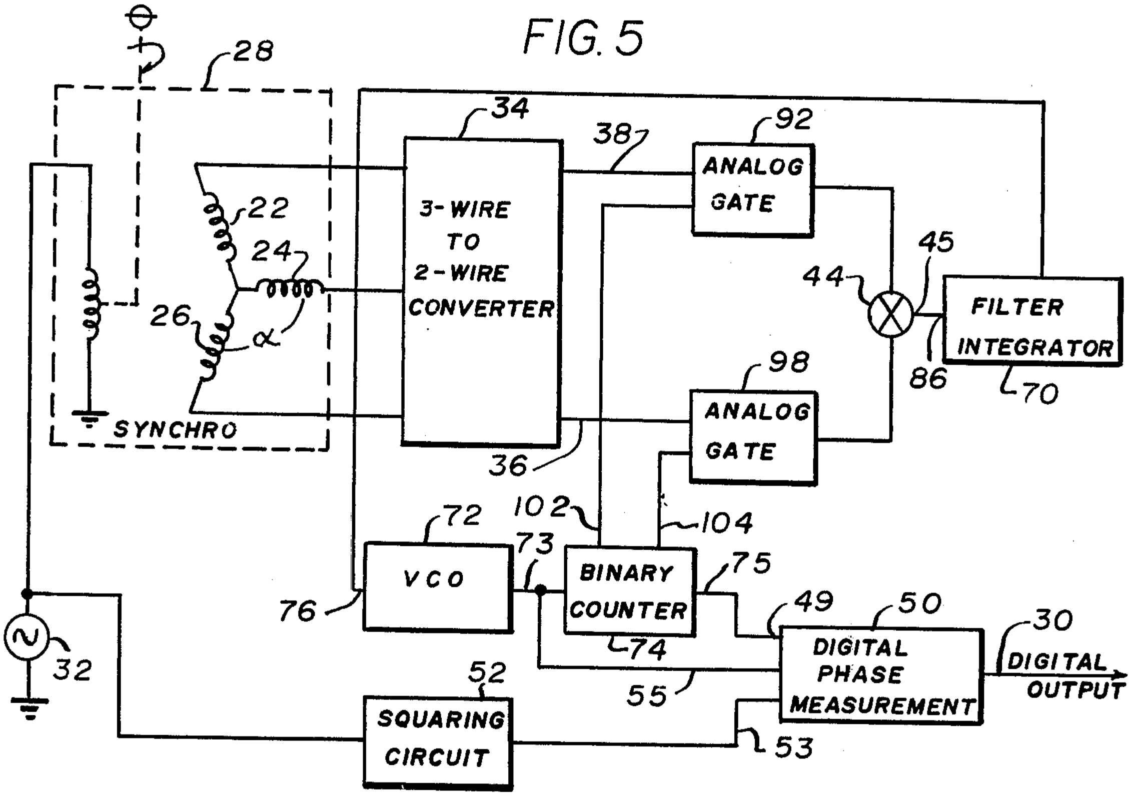
FIG. 5 is a block diagram of an embodiment of applicant's invention similar to that of FIG. 5 but in which phase shifting is performed in the digital realm.

In FIG. 5, a block diagram of an embodiment of applicant's invention similar to that of FIG. 4 is shown except that the 90° phase delay circuit 94 has been eliminated by using the appropriate digital signals from binary counter 74. This eliminates another frequency dependent element in the circuit to provide even greater accuracy. RC phase delay circuits used in the prior art have been a frequent source of error due to their frequency dependent characteristics. The circuit otherwise operates in an identical fashion as that of FIG. 4. Briefly, the signal produced on output 102 of binary counter 74 comprises a square wave signal which is in quadrature with the signal produced on output 104 such that the cosine synchro signal on output 38 is gated through to summation circuit 44 from $\phi$ to $\phi$+180° while the sine synchro signal on output 36 is gated through to summation circuit 44 from 90°+$\phi$ to 270°+$\phi$.

Figure 6:
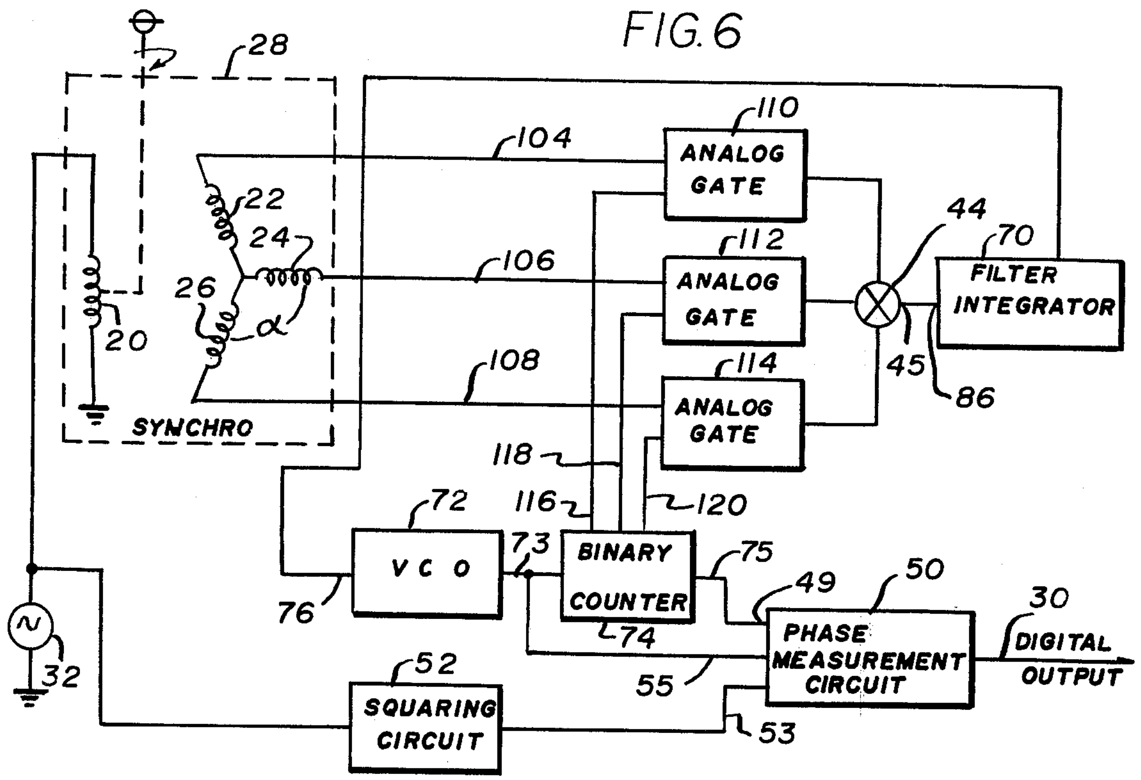
FIG. 6 is a block diagram of yet another embodiment of applicant's invention in which the conventional three-wire to two-wire converter circuit has been eliminated.

Turning now to FIG. 6, a block diagram of a further embodiment of applicant's invention is shown in which the 3-wire to 2-wire converter circuit 34 has been eliminated. Such converter circuits in the prior art have also been a source of frequency dependent error. Secondary windings 22, 24 and 26 are respectively coupled to analog gate circuits 110, 112 and 114 through input leads 104, 106 and 108, respectively. The signals produced at inputs 104, 106 and 108 are $E\sin\theta\sin\omega t$, $E\sin(\theta-120°)\sin\omega t$ and $E\sin(\theta 120°)\sin\omega t$, respectively. The analog gates 110, 112 and 114 are controlled by outputs 116, 118 and 120, respectively, to conduct the appropriate 180° portions of the synchro signal applied thereto to the summation circuit 44. The output signals 116, 118 and 120 from binary counter 74 are selected to respectively provide one-state pulses to their analog gates from $\phi$ to 180°+$\phi$, $\phi$+120 to $\phi$+300°, and $\phi$−120° to $\phi$+60°, respectively. These portions of the synchro signals from summation circuit 44 are applied to filter integrater circuit 70 to provide an error voltage $V_E$ which may be mathematically represented as:

$$V_E = \int_{\phi}^{\phi+180°} E\sin\theta\sin(\omega t)\,d(\omega t) + \int_{\phi+120°}^{\phi+300°} E\sin(\theta+120°)\sin(\omega t)\,d(\omega t) + \int_{\phi-120°}^{\phi+60°} E\sin(\theta-120°)\sin(\omega t)\,d(\omega t)$$

which integrates to $V_E = 3E\sin(\theta-\phi)$ which may be approximated by $V_E = 3E(\theta-\phi)$ for small values of $\theta-\phi$.

Figure 7:
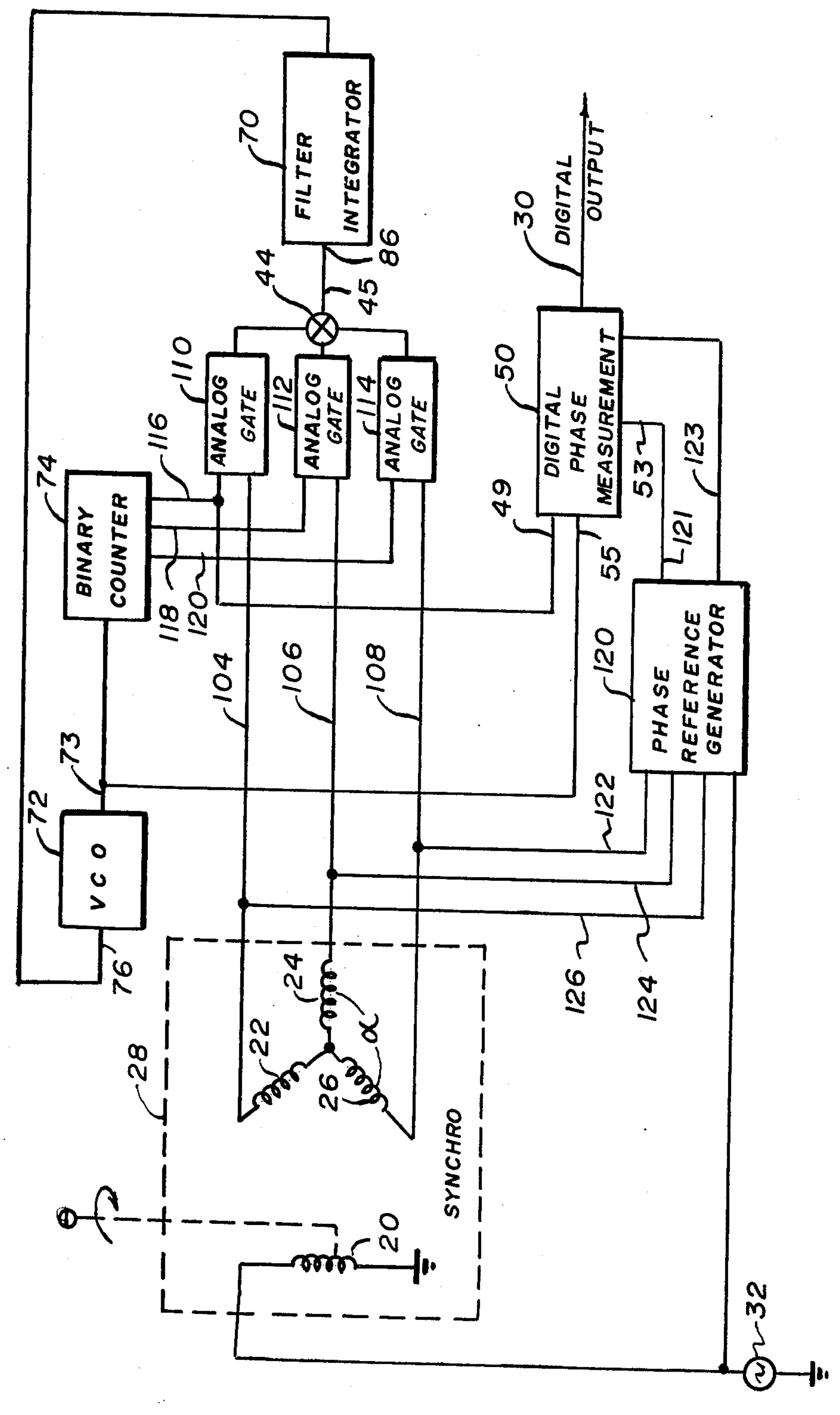
FIG. 7 is a block diagram of still a further embodiment of applicant's invention similar to that of FIG. 7 but in which a phase reference generator is utilized to eliminate error due to inherent phase shift occurring during signal transfer between the primary and secondary windings of the synchro.

Finally, referring to FIG. 7, a block diagram of yet a further embodiment of applicant's invention is shown identical to that of FIG. 6 except for the addition of a phase reference generator circuit block 120 which compensates for inherent phase shift occurring during signal transfer between the primary winding and the secondary windings. Such a circuit is shown and described in the application of Daniel R. Asmussen, Ser. No. 81,899, filed Oct. 19, 1970 and assigned to the assignee of the present invention, now U.S. Pat. No. 3,676,659. Reference may be had to that application for a detailed description of the phase reference generator, but for purposes of this invention, the following brief discussion should be sufficient.

Synchros, resolvers and the like, have an inherent phase shift (not to be confused with the cyclical outputs caused by the relative angular position $\theta$ of the primary winding) which occurs during signal coupling between the primary winding and the secondary windings. This undesirable phase shift may be on the order of 8°–10°, and prior solid state converters could not distinguish between this inherent phase shift and the phase shift $\theta$.

This is eliminated by utilization of the phase reference generator 120 which provides a reference excitation signal on output 121 to excitation signal input 53 of digital phase measurement circuit 50 that is phase shifted from the true excitation signal by an amount equal to the inherent phase shift in the synchro. Circuits of the phase reference generator circuit block 120 are coupled to the secondary windings 22, 24 and 26 through input leads 122, 124 and 126 and determine the zero cross-over points of the signal combinations which correspond to the zero cross-over points of the primary excitation signals except for the inherent phase shift. The detected zero cross-over point is used to phase shift a primary winding excitation signal from source 32 in order to produce a corrected or reference excitation signal on output 121 which when compared with the phase signal on input 49, produces a signal solely dependent on the true relative angular position of the primary winding. The circuit may also provide a transfer signal on output 123 coupled to register 66 of digital phase measurement circuit 50 so that it will be cleared to register a new angle at the beginning of each new cycle.

I claim:

1. In a system having a primary winding coupled with a source of energization signal and a plurality of secondary windings each having an alternating signal induced therein with an amplitude dependent upon the angular position of said primary winding relative to said secondary windings, a circuit for determining the angular position, comprising:

- input means coupled to the plurality of secondary windings for providing at least two alternating input signals carrying amplitude information related to the amplitudes of the alternating signals from the plurality of secondary windings;
- controllable oscillator means for generating cyclical signals having a frequency and phase varying in proportion to signals at an error input;
- a phase locked loop for controlling the oscillator means to cause the cyclical signals to have a frequency variable in direct proportion with the frequency of the energization signal and a phase directly proportional with said angular position, including
- analog gate means coupled to the input means for sampling the alternating input signals to develop sampled signals,
- means coupling the oscillator means to the analog gate means for causing the analog gate means to sample portions of the alternating input signals in response to the phase of the cyclical signals, and
- error means connecting the analog means to the error input for varying the phase of the cyclical signals under control of the sampled signals; and
- phase comparator means coupled to the oscillator means and to the source for comparing the relative phase between the cyclical signals and the energization signal to determine said angular position.

2. The circuit of claim 1 wherein the oscillator means comprises a clock for generating the cyclical signals at a frequency which is a multiple of the frequency of the energization signal and a frequency divider circuit driven by the clock to develop cyclical signals having frequencies that are submultiples of the multiple frequency cyclical signals, the coupling means connects the frequency divider circuit to the analog gate means to control sampling in response to the submultiple frequency cyclical signals, and

- the phase comparator means includes a gate coupled to the clock for passing the multiple frequency cyclical signals in proportion to the relative phase between the submultiple frequency cyclical signals and the energization signal.

3. The circuit of claim 2 wherein the phase comparator means further includes counter means for counting the multiple frequency cyclical signals passed by the gate to develop a digital signal representative of the angular position.

4. The circuit of claim 1 wherein said error means includes integrating means coupled to the analog gate means for integrating the sampled signals to develop an error signal coupled to the error input.

5. The circuit of claim 4 wherein said error means includes summing means connecting the analog gate means to the integrating means for summing the sampled signals before the integrating means integrates the sampled signals.

6. The circuit of claim 1 wherein said analog gate means selects 180° portions from each of the alternating input signals during each cycle thereof.

7. The circuit of claim 1 wherein said analog gate means comprises an analog gate switch associated with each of said plurality of secondary windings, the input means directly couples each of the secondary windings to a different one of the analog gate switches, each of said analog gate switches being responsive to the phase of the cyclical signals to select a portion of the alternating input signals coupled thereto.

* * * * *